United States Patent [19]

Wong

[11] Patent Number: 5,309,370
[45] Date of Patent: May 3, 1994

[54] METHOD FOR PLACEMENT OF CONNECTORS USED INTERCONNECTING CIRCUIT COMPONENTS IN AN INTEGRATED CIRCUIT

[75] Inventor: Dale M. Wong, San Francisco, Calif.

[73] Assignee: VLSI Technology, Inc., San Jose, Calif.

[21] Appl. No.: 626,819

[22] Filed: Dec. 13, 1990

[51] Int. Cl.$^5$ ............................................. G06F 15/20
[52] U.S. Cl. ............................... 364/490; 364/488
[58] Field of Search ............... 364/488, 489, 490, 491

[56] References Cited

U.S. PATENT DOCUMENTS

| | | | |
|---|---|---|---|
| 4,615,011 | 9/1986 | Linsker | 364/491 |
| 4,630,219 | 12/1986 | DiGiacomo et al. | 364/488 |
| 4,777,606 | 10/1988 | Fournier | 364/491 |
| 4,852,016 | 7/1989 | McGehee | 364/491 |
| 4,910,680 | 3/1990 | Hiwatashi | 364/491 |
| 5,019,997 | 5/1991 | Haller | 364/491 X |
| 5,072,402 | 12/1991 | Ashtaputre et al. | 364/488 X |
| 5,079,717 | 1/1992 | Miwa | 364/488 X |
| 5,151,868 | 9/1992 | Nishiyama et al. | 364/490 |

OTHER PUBLICATIONS

Sara Baase, "Computer Algorithms, Introduction to Design and Analysis", Addison-Wesley Publishing Company, Reading Massachusetts, 1978, pp. 127-136.
Charles Ng, et al. *A Hierarchical Floor-Planning, Placement, and Routing Tool for Sea-of-Gates Designs*, IEEE 1989 Customs Integrated Circuits Conferences, pp. 3.3.1-3.3.4.
David Hsu, et al., *The ChipCompiler, An Automated Standard Cell/Macrocell Physical Design Tool*, IEEE 1987 Custom Integrated Circuits Conference, pp. 488-491.

*Primary Examiner*—Edward R. Cosimano
*Attorney, Agent, or Firm*—Douglas L. Weller

[57] ABSTRACT

Inter-area connectors are optimally placed on peripheries of bounded areas within an integrated circuit. Once circuit components are placed upon the integrated circuit, global optimum paths for connector lines between signal connectors within all the circuit components are calculated. This may be performed by calculating a global optimum rectilinear spanning tree for each net of signal connectors. Once the global optimum paths are calculated, inter-area connectors are placed at each location on a periphery of any of the circuit components where a global optimum path crosses the periphery. Finally, connector lines may be placed along the global optimum paths. For signal connectors and inter-area connectors within each circuit component, internal connector lines are routed between signal connectors along the global optimum paths within the circuit component. Also, between the circuit components, inter-area connector lines are routed between inter-area connectors along the global optimum paths.

8 Claims, 5 Drawing Sheets

METHOD FOR PLACEMENT OF CONNECTORS USED INTERCONNECTING CIRCUIT COMPONENTS IN AN INTEGRATED CIRCUIT

BACKGROUND

The present invention concerns optimal placement of inter-area connectors on the periphery of bounded areas on an integrated circuit An integrated circuit is generally divided into bounded areas. All the circuitry within each bounded area may be generally referred to as a circuit component. Signal connectors within a circuit component are connected to other signal connectors in the same circuit component through internal connector lines. Signal connectors are connected to signal connectors in other circuit components by first being connected through internal connector lines to inter-area connectors located on the periphery of the circuit components. The inter-area connectors are connected together through inter-area connector lines. A group of all signal connectors and inter-area connectors which are to be routed together is called a connector net. All connector lines, whether internal or inter-area, have a measurable width and take up space on the integrated circuit which is directly proportional to their length.

When selecting locations on the integrated circuit in which to place the circuit components, it is desirable to select locations so that the area on the integrated circuit is optimally utilized. Optimal placement of circuit components occurs when the dead space, that is area between circuit components which is not utilized by circuit components, is minimized, and when the estimated total length of connector lines is minimized.

Once circuit components are placed on an integrated circuit, a router is used to route connector lines between the signal connectors. In the prior art, typically, a router program is used to first route all signal connectors internally within each circuit component. In doing this internal routing, inter-area connectors are first placed on the periphery of each circuit component to account for routing of nets of signal connectors which span more than one circuit component. The process of internal routing may include an internal router going though multiple stages of congestion estimation, initial routing, and rip-up and re-route in order to ensure that the number of tracks required in each internal channel does not exceed the channel capacity. Once the internal routing is complete, an inter-area router connects all the inter-area connectors.

In the prior art, when selecting a location on a periphery of a circuit component for the placement of an inter-area connector, the prime objective has been to align the inter-area connector with other inter-area or internal connectors which belong to the same connector net. However, this often results in non-optimal routing of connector lines within circuit components. There has been little or no work done on the problem of selecting the location of inter-area connectors to simultaneously optimize inter-area and internal routing of connector lines. For examples of prior art routing schemes, see for example, Charles Ng, Sunil Ashtaputre, Elizabeth Chambers, Kieu-huong Do, Siu-tong Hui, Rajiv Mody, and Dale Wong; *A Hierarchical Floor-Planning, Placement, and Routing Tool for Sea-of-Gates Designs*, IEEE 1989 Custom Integrated Circuits Conference, pp. 3.3.1-3.3.4; and see David Hsu, Leslie Grate, Charles Ng, Mark Hartoog and Denis Bohm, *The ChipCompiler, An Automated Standard Cell/Macrocell Physical Design Tool,* IEEE 1987 Custom Integrated Circuits Conference, p 488-491.

SUMMARY OF THE INVENTION

In accordance with the preferred embodiment of the present invention, a method for placing inter-area connectors on peripheries of bounded areas within an integrated circuit is presented. Once circuit components are placed upon the integrated circuit, global optimum paths for connector lines between signal connectors within all the circuit components are calculated. This may be performed by calculating a global optimum rectilinear spanning tree for each net of signal connectors. Once the global optimum paths are calculated, inter-area connectors are placed at each location on a periphery of any of the circuit components where a global optimum path crosses the periphery. Finally, connector lines may be placed along the global optimum paths. For signal connectors and inter-area connectors within each circuit component, internal connector lines are routed between signal connectors along the global optimum paths within the circuit component. Also, between the circuit components, inter-area connector lines are routed between inter-area connectors along the global optimum paths.

DESCRIPTION OF THE PREFERRED EMBODIMENT

Figure 1:
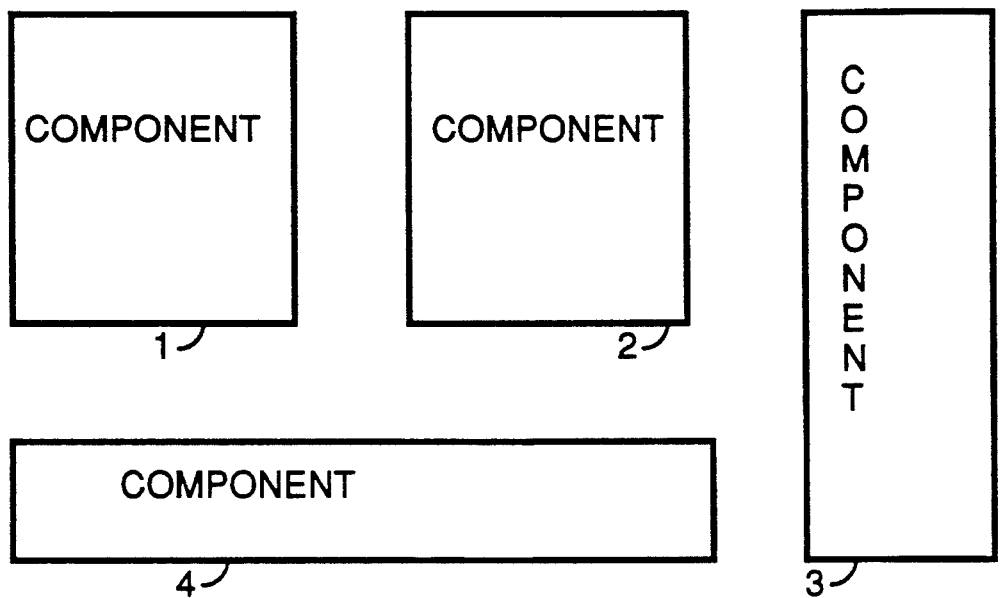
FIG. 1 shows circuit components placed on an integrated circuit.

Typically, when designing an integrated circuit, the integrated circuit is logically grouped into discrete circuit components. The circuit components are placed in bounded areas on the integrated circuit For example, FIG. 1 shows a circuit component 1, a circuit component 2, a circuit component 3 and a circuit component 4 organized on an integrated circuit. In a typical VLSI circuit, the number of such circuit components may vary from 1 to 100. Each circuit component is connected to other circuit components by a series of connector lines. In a typical VLSI circuit, there may be between 1 and 1000 connector lines between each of the circuit components.

The circuit components are typically rectangular in shape. They are placed so that dead space between the circuit components is minimized and the estimated total length of connector lines is minimized. For further information on placement of circuit components on an integrated circuit, see for example the papers cited in the Background which gives further description of methodology by which circuit components may placed in bounded areas on an integrated circuit.

Once a bounded area within the integrated circuit has been selected for each circuit component, it is necessary to interconnect signal connectors both within each circuit component and between circuit components. These signal connectors are, for example, at inputs and outputs of standard cells if a standard cell design is used. Alternately, in sea-of-gates designs, the signal connectors are placed at inputs and outputs of gate array macro cells.

Figure 2:
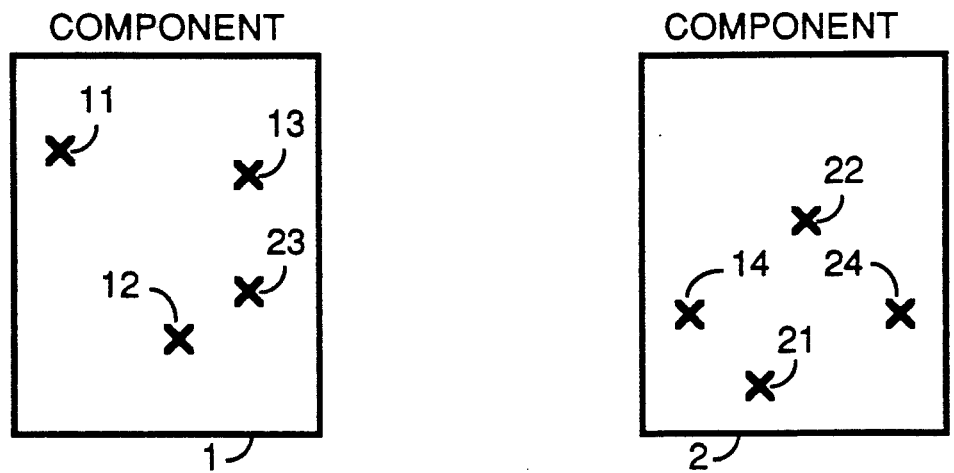
FIG. 2 shows signal connectors within two circuit components.

Each signal connector is connected to one or more signal connectors within or outside the circuit component in which the signal connector resides. A group of all signal connectors which are to be routed together is called a connector net. For example, FIG. 2 shows a signal connector 11, a signal connector 12, a signal connector 13 and a signal connector 23 within circuit component 1. FIG. 2 also shows a signal connector 21, a signal connector 22, a signal connector 14 and a signal connector 24 within circuit component 2. In the given example, signal connector 11 is to be connected to signal connector 21. Signal connector 12 is to be connected to signal connector 22. Signal connector 13 is to be connected to signal connector 23. Signal connector 14 is to be connected to signal connector 24.

The routing of connector lines between signal connectors may be done in a number of ways. Typically in the prior art, inter-area connectors are placed on the periphery of circuit components to account for routing which spans more than one circuit component. An internal router then performs internal routing within each of the circuit areas. Finally, an inter-area router performs the external routing to connect the inter-area connectors.

Figure 3:
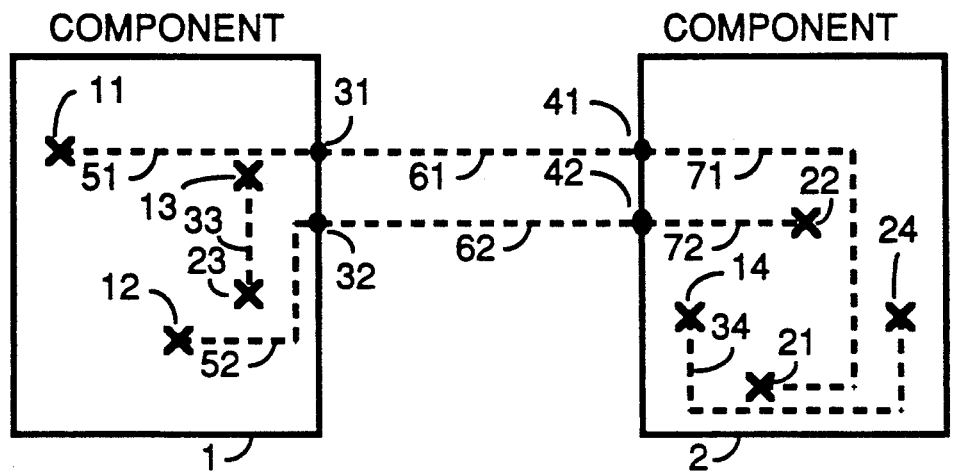
FIG. 3 shows a routing for connector lines placed between the signal connectors within the two circuit components shown in FIG. 2

For example, as demonstrated by FIG. 3, an inter-area connector 31 and an inter-area connector 32 are placed on component 1. Further an inter-area connector 41 and an inter-area connector 42 are placed on component 2.

Once inter-area connectors have been placed, internal routing within circuit component 1 and circuit component 2 is performed. For example, within circuit component 1, a connector line 51 is shown routed between signal connector 11 and inter-area connector 31. A connector line 33 is shown routed between signal connector 13 and signal connector 23. A connector line 52 is shown routed between signal connector 12 and inter-area connector 32. Similarly, within circuit component 2, a connector line 71 is shown routed between signal connector 21 and inter-area connector 41. A connector line 34 is shown routed between signal connector 14 and signal connector 24. A connector line 72 is shown routed between signal connector 22 and inter-area connector 42.

Once internal routing is complete, inter-area routing between circuit component 1 and circuit component 2 is performed. For example, an inter-area line connector 61 is shown between inter-area connector 31 and inter-area connector 41. Similarly, an inter-area line connector 62 is shown between inter-area connector 32 and inter-area connector 42.

The preferred embodiment of the present invention improves on the above-described routing scheme. In the preferred embodiment of the present invention, once circuit components are placed, the boundaries of the circuit components are ignored and global optimum rectilinear spanning trees are calculated for each connector net. The spanning trees are calculated using all the signal connectors of the connector net without regard to which circuit components within which the signal connectors lie.

Figure 4:
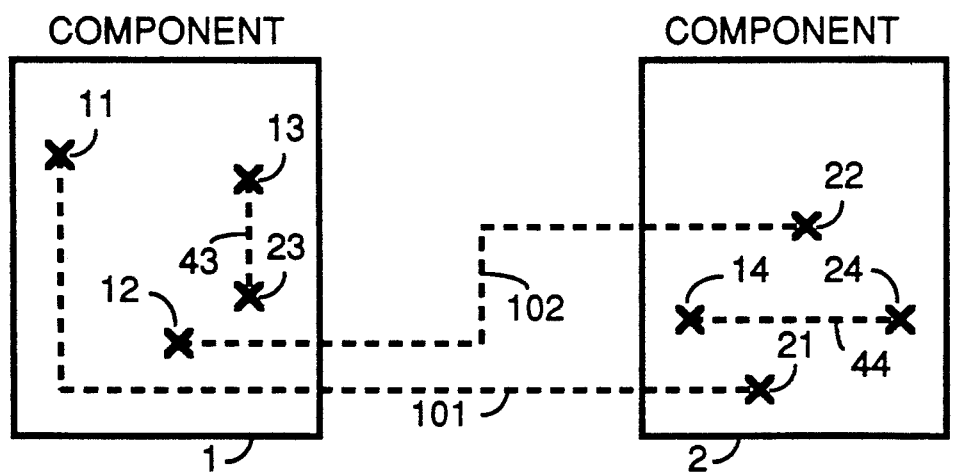
FIG. 4 shows an alternate routing for connector lines based on a calculation of global optimum paths between the signal connectors within the two circuit components shown in FIG. 2 in accordance with the preferred embodiment of the present invention.

For example, FIG. 4 shows global optimum rectilinear nets between signal connectors. Specifically, a net 101 is shown between signal connector 11 and signal connector 21. A net 102 is shown between signal connector 12 and signal connector 22. A net 43 is shown between signal connector 13 and signal connector 23. A net 44 is shown between signal connector 14 and signal connector 24.

Figure 5:
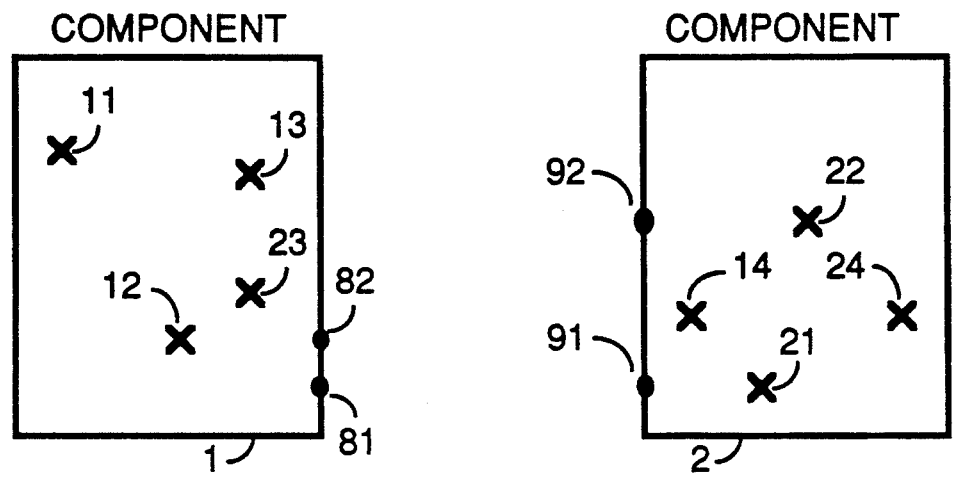
FIG. 5 shows inter-area connectors placed on the two circuit components shown in FIG. 2 in accordance with the preferred embodiment of the present invention.

Locations for inter-area connectors are selected where the global optimum rectilinear nets cross boundaries of the circuit components. For example, as shown in FIG. 5, an inter-area connector 81 is placed on the periphery of circuit component 1 where the periphery is crossed by net 101. An inter-area connector 82 is placed on the periphery of circuit component 1 where the periphery is crossed by net 102. An inter-area connector 91 is placed on the periphery of circuit component 2 where the periphery is crossed by net 101. An inter-area connector 92 is placed on the periphery of circuit component 2 where the periphery is crossed by net 102.

The cost function used in the algorithm which determines the global optimum rectilinear spanning tree for each net of signal connectors takes into account the maximum congestion along a tree segment as well as the rectilinear distance between signal connectors in the net. In this way, the routing can be optimized globally with little loss of information across the bounded area.

Figure 6:
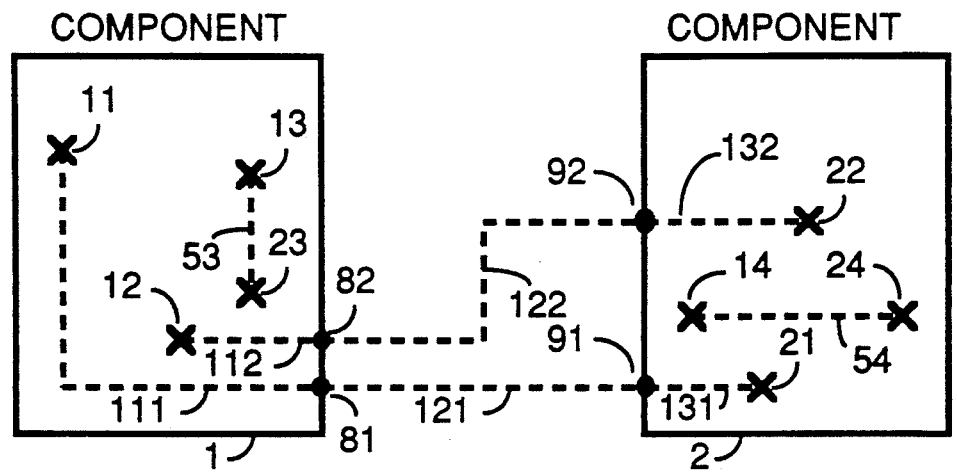
FIG. 6 shows connector lines placed between the inter-area connectors and signal connectors shown in FIG. 5 in accordance with the preferred embodiment of the present invention.

Once the inter-area connectors have been placed, connector lines are placed between the nets of signal connectors and inter-area signal connectors along the paths of the global optimum rectilinear nets. For example, in FIG. 6 the inter-area connectors and signal connectors shown in FIG. 5 are shown connected using connector lines.

Specifically, within circuit component 1, a connector line 111 is shown routed between signal connector 11 and inter-area connector 81. A connector line 53 is shown routed between signal connector 13 and signal connector 23. A connector line 112 is shown routed between signal connector 12 and inter-area connector 82. Similarly, within circuit component 2, a connector line 131 is shown routed between signal connector 21 and inter-area connector 91. A connector line 54 is shown routed between signal connector 14 and signal connector 24. A connector line 132 is shown routed between signal connector 22 and inter-area connector 92. Also, an inter-area line connector 121 is shown between inter-area connector 81 and inter-area connector 91. And, an inter-area line connector 122 is shown between inter-area connector 82 and inter-area connector 92.

Table 1 below contains pseudo-code for a program which constructs a minimum spanning tree for each net of signal connectors and then traverses minimum spanning trees in order to determine locations of connectors on the periphery of major components.

In lines 1 through 3 of the program, the integrated circuit design is divided into rectangular sub-areas. Congestion within each sub-area is monitored as the minimum spanning trees are constructed.

In lines 4 through 7 the variables which keep track of cost are initialized.

Lines 9 through 47 are a while loop. In each pass of the while loop an optimal spanning tree for every net of connector lines is constructed. There will be at least two passes through the while loop and usually more. In the first pass through the while loop, the program constructs a minimal spanning tree for each net of connector lines. In each successive pass through the while loop, the program reconstructs the minimal spanning tree for each net in an attempt to further optimized the paths of the connector lines for each net.

In lines 11 through 47, for each net the program constructs or reconstructs a minimum spanning tree. In selecting the minimum spanning tree, the program attempts to minimize the cost of each net. The cost is determined as a function of the distance traveled by connector lines and as a function of the congestion added to the circuit designed which is incurred by adding the net to integrated circuit.

In lines 12 through 23 housekeeping functions are performed to re-calculate the minimum cost for adding the net to integrated circuit and to initialize the tree for the net.

Lines 25 through 46 are a while loop. In this while loop the tree for the net is constructed. In each pass through the loop a point (i.e. connector) is selected to be added to the tree. At each pass through the loop, it is determined which point not in the tree could be added to the tree with the minimum cost. This point is then selected to be added to the tree by placing the point in the variable first_point.

In lines 26 through 31, housekeeping functions are performed which include, adding the point currently in the variable first_point to the tree. Also, the cost of adding first_point to the tree is added to the total cost of the network. Additionally, the congestion map is updated and the constants are initialized in order to prepare to find the next point to be added to the tree.

In lines 32 to 44, every point in the net which is not currently in the tree is considered a candidate for being added to the tree. In line 37, the cost for adding each point is calculated based on a function taking into account distance (i.e. minimum length of a connector line from the point not in the tree to the closest point in the tree) and congestion (i.e., the added congestion caused by adding the connector line). The exact weight the function gives to distance and congestion is based on the design goals of the programmer. Further, this function can be changed during execution of the program so that, for example, on the first pass through the while loop in lines 9 through 47, more weight is given to minimizing the distance travelled by the connector lines. In subsequent passes through the while loop in lines 9 through 47, the function can be varied so that more weight is given to the congestion. At the end of the for loop of lines 32 to 44, the point with the minimum cost to be added to the tree is in the variable best_point. The optimal path for a connector line to be placed between the best_point to any point currently in the tree is stored in the variable chosen_path [best_point]. The cost of adding this chosen path to the net is stored in the variable best_cost.

After the while loop of lines 9 through 47 is completed, the optimized global spanning trees may be traversed. Lines 49 through 53 shows programming pseudo code which traverses the trees in order to place connectors at the periphery of major components. Additionally, the trees may be traversed, for example, for the purpose of actually laying the connector lines.

TABLE 1

```
divide the chip into a grid of rectangular sub-areas
for each sub-area on the congestion map
   congestion = 0
for net = 1 to number_of_nets
   current_cost [net] = 0
current_total_cost = infinity - 1
previous_total_cost = infinity
while current_total_cost < previous total_cost
   previous_total_cost = current_total_cost
   for each net (net = 1 to number_of_nets)
      current_total_cost = current_total_cost - current_cost[net]
      current_cost [net] = 0
      for every point in net
         remove chosen_path [point] from congestion_map
      empty tree
      for every point in net (point = 1 to number_of_points)
         best_point_in_tree [point] = none
         cost_to_add_to_tree [pointg] = infinity
      first_point = any point in the list (1 to number_of_points)
      best_cost = 0
      chosen_path [first_point] = none
      count = 0
      while count < number_of_points
         add first_point to tree
         current_cost [net] = current cost [net] + best_cost
         for each sub-area crossed by chosen_path [first_point]
            congestion = congestion + 1
         best_point = none
         best_cost = infinity
         for point = 1 to number_of_points
            if point is not in tree
               find rectilinear distance [first_point, point]
               for each path of minimum rectilinear distance
                  find congestion
                  cost = function (distance, congestion)
```

TABLE 1-continued

```
         if cost < cost_to_add_to_tree [point]
              cost_to_add_to_tree [point] = cost
              best_pont_in_tree [point] = first_point
              chosen_path [point] = path
         if cost_to_add_to_tree [point] < best_cost
              best_cost = cost_to_add_to_tree [point]
              best_point = point
    first_point = best_point
    count = count + 1
    current_total_cost = current_total_cost + current_cost[net]
for each net (1 to number_of_nets)
    for each point in net (1 to number_of_points)
         follow chosen_path [point]
         if chosen_path [point] crosses a major component's periphery
              place a connector for this net at the intersection point
```

Figure 7:
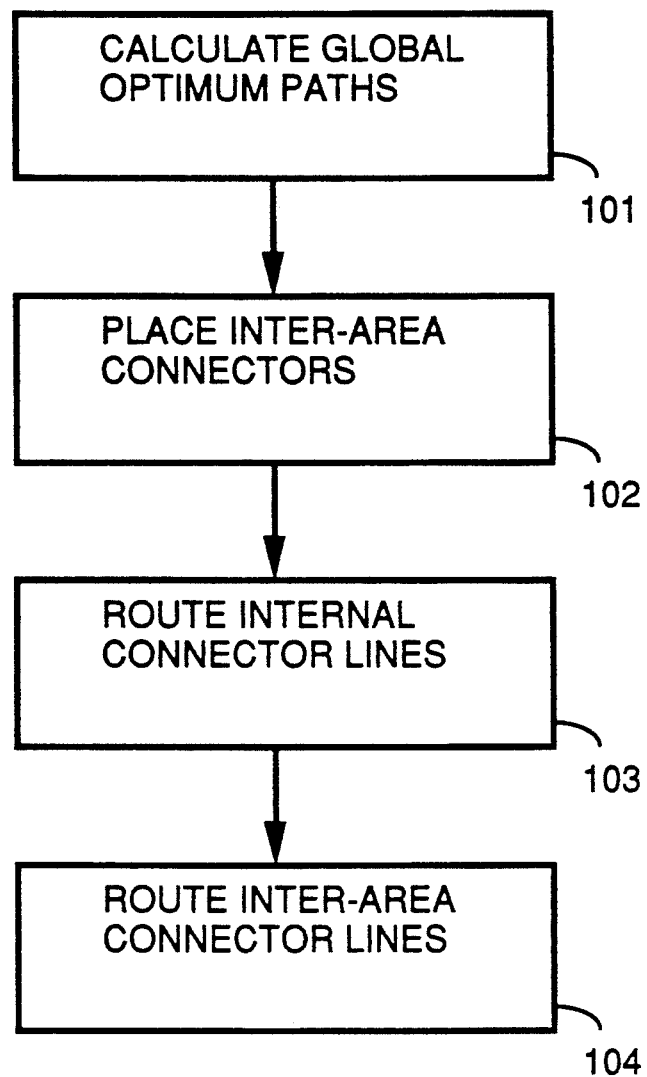
FIG. 7, FIG. 8 and FIG. 9 is a flowchart which shows the features of the present invention in accordance with the preferred embodiment of the present invention.
Figure 8:
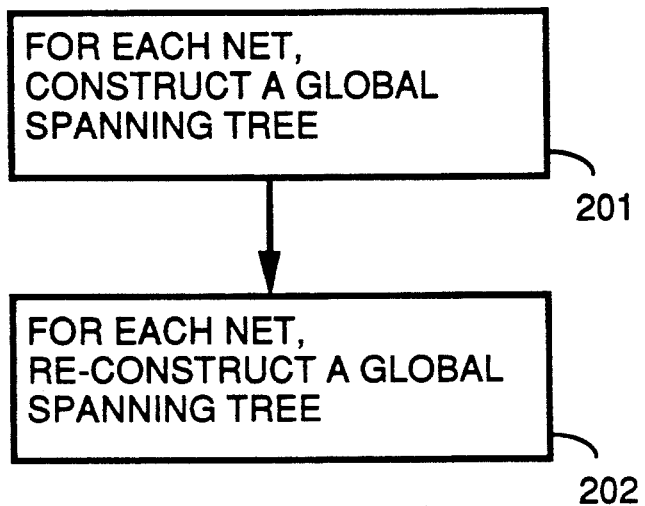
Figure 9:
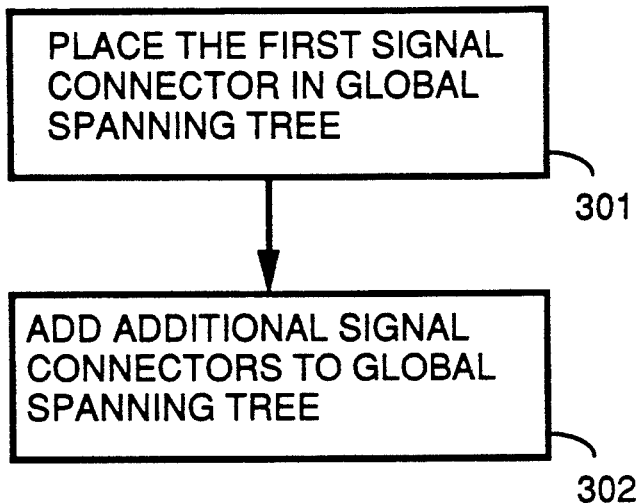

FIGS. 7, 8 and 9 show a flowchart which is a summary of the pseudo-code program shown in Table 1. FIG. 7 shows an overview of a method for routing line connectors between signal connectors within circuit components placed on an integrated circuit. A step 101 and a step 102 give an overview of a method for placing inter-area connector on peripheries of bounded areas within an integrated circuit.

In step 101, global optimum paths are calculated for connector liens between the signal connectors. In step 102, inter-area connectors are placed at each location on a periphery of any of the circuit components where a global optimum path crosses the periphery. In a step 103, internal connector lines between signal connectors along the global optimum paths within the circuit component are routed for signal connectors and inter-area connectors within each circuit component. In a step 104, inter-area connector lines are routed between inter-area connectors along the global optimum paths between the circuit components.

FIG. 8 shows substeps of step 101. In a substep 201, a global minimum rectilinear spanning tree is constructed for each net of signal connectors. In a substep 202, a global minimum rectilinear spanning tree is reconstructed for each net of signal connectors. What is meant by a spanning tree is a set of connection lines which connect all the signal connectors within a net. What is meant by a global spanning tree is that the spanning tree extends outside a single component to connect all signal connectors in all circuit components of the circuitry. What is meant by a global rectilinear spanning tree is that the connection lines are formed of straight wires which are connected in a straight line or at right angles. What is meant by a global minimum (or optimal) rectilinear spanning tree is that the connection lines are weighted (i.e., each is assigned a cost), and the spanning tree has a minimal weight (cost).

FIG. 9 shows substeps which may be used both for construction of a global spanning tree for a single net (substep 201) and for re-construction of a global spanning tree for a single net (substep 202). In a substep 301, a first signal connector is placed in the global minimum rectilinear spanning tree. In a step 302, additional signal connectors are added to the global minimum rectilinear spanning tree based on a function which calculates a cost of adding each signal connector to the global minimum rectilinear spanning tree. When constructing the global spanning tree in step 201, a first function is used to calculate the cost of adding each signal connector to the global minimum rectilinear spanning tree. When re-constructing the global spanning tree in step 202, a second function is used to calculate the cost of adding each signal connector to the global minimum rectilinear spanning tree. The second function in a different manner from the first function balances considerations of congestion and path length when calculating cost of adding each signal connector to the global minimum rectilinear spanning tree.

We claim:

1. A method for placing inter-area connectors on peripheries of bounded areas within an integrated circuit, the method being a computer implemented process and comprising the steps, performed by a computer, of:
    (a) calculating global optimum paths for connector lines between signal connectors within all the bounded areas; and,
    (b) placing inter-area connectors at each location on a periphery of any of the bounded areas where a global optimum path crosses the periphery.

2. A method as in claim 1 wherein step (a) is performed by calculating a global optimum rectilinear spanning tree for each net of signal connectors.

3. A method as in claim 1 wherein step (a) includes the following substeps:
    (a1) for each net of signal connectors, constructing a global minimum rectilinear spanning tree, including the substeps of:
        placing a first signal connector from the net of signal connectors in the global minimum rectilinear spanning tree,
        adding additional signal connectors from the net of signal connectors to the global minimum rectilinear spanning tree based on a first function which calculates a cost of adding each signal connector to the global minimum rectilinear spanning tree; and,
    (a2) for each net of signal connectors, reconstructing a global minimum rectilinear spanning tree, including the substeps of:
        placing the first signal connector from the net of signal connectors in the global minimum rectilinear spanning tree,
        adding additional signal connectors from the net of signal connectors to the global minimum rectilinear spanning tree based on a second function which calculates a cost of adding each signal connector to the global minimum rectilinear spanning tree.

4. A method as in claim 3 wherein the second function in a different manner from the first function balances considerations of congestion and path length when calculating cost of adding each signal connector to the global minimum rectilinear spanning tree.

5. A method for routing line connectors between signal connectors within circuit components placed on an integrated circuit, the method being a computer implemented process and comprising the steps, performed by a computer, of:

(a) calculating global optimum paths for connector lines between the signal connectors;

(b) placing inter-area connectors at each location on a periphery of any of the circuit components where a global optimum path crosses the periphery;

(c) for signal connectors and inter-area connectors within each circuit component routing internal connector lines between signal connectors along the global optimum paths within the circuit component; and, (d) routing inter-area connector lines between inter-area connectors along the global optimum paths between the circuit components.

6. A method as in claim 3 wherein step (a) is performed by calculating a global optimum rectilinear spanning tree for each net of signal connectors.

7. A method as in claim 5 wherein step (a) includes the following substeps:

(a1) for each net of signal connectors, constructing a global minimum rectilinear spanning tree, including the substeps of:

placing a first signal connector from the net of signal connectors in the global minimum rectilinear spanning tree, adding additional signal connectors from the net of signal connectors to the global minimum rectilinear spanning tree based on a first function which calculates a cost of adding each signal connector to the global minimum rectilinear spanning tree; and, (a2) for each net of signal connectors, reconstructing a global minimum rectilinear spanning tree, including the substeps of:

placing the first signal connector from the net of signal connectors in the global minimum rectilinear spanning tree, adding additional signal connectors from the inlet of signal connectors to the global minimum rectilinear spanning tree based on a second function which calculates a cost of adding each signal connector to the global minimum rectilinear spanning tree.

8. A method as in claim 7 wherein the second function in a different manner from the first function balances considerations of congestion and path length when calculating cost of adding each signal connector to the global minimum rectilinear spanning tree.

* * * * *